(12) United States Patent  
Beckerman et al.

(10) Patent No.: US 9,312,418 B2  
(45) Date of Patent: Apr. 12, 2016

(54) FRAMELESS PHOTOVOLTAIC MODULE

(71) Applicant: Prism Solar Technologies Incorporated, Highland, NY (US)

(72) Inventors: Wayne Beckerman, Stone Ridge, NY (US); Jose E. Castillo-Aguilella, Tucson, AZ (US); Paul S. Hauser, Tucson, AZ (US); Michael Sprague, Ulster Park, NY (US)

(73) Assignee: PRISM SOLAR TECHNOLOGIES, INC., Highland, NY (US)

( * ) Notice: Subject to any disclaimer, the term of this patent is extended or adjusted under 35 U.S.C. 154(b) by 0 days.

(21) Appl. No.: 14/488,564

(22) Filed: Sep. 17, 2014

(65) Prior Publication Data

US 2015/0007873 A1    Jan. 8, 2015

Related U.S. Application Data

(63) Continuation of application No. 13/775,744, filed on Feb. 25, 2013, now Pat. No. 8,853,525, and a continuation-in-part of application No. 13/675,855, filed on Nov. 13, 2012.

(Continued)

(51) Int. Cl.  
*H01L 31/048* (2014.01)  
*H01L 31/042* (2014.01)  
*H02S 40/34* (2014.01)  
*H01L 31/02* (2006.01)  
*H02S 40/22* (2014.01)  
*H01L 31/054* (2014.01)

(52) U.S. Cl.  
CPC ...... *H01L 31/0488* (2013.01); *H01L 31/02013* (2013.01); *H01L 31/042* (2013.01); *H01L 31/048* (2013.01); *H01L 31/054* (2014.12); *H02S 40/22* (2014.12); *H02S 40/34* (2014.12); *Y02E 10/50* (2013.01)

(58) Field of Classification Search  
CPC ... H01L 31/0488; H01L 31/048; H01L 31/05; H01L 31/0504  
USPC .......................... 136/244, 251, 252, 256, 259  
See application file for complete search history.

(56) References Cited

U.S. PATENT DOCUMENTS

| | | | |
|---|---|---|---|
| 2003/0116185 A1* | 6/2003 | Oswald | H01L 31/02008 136/251 |
| 2006/0207646 A1 | 9/2006 | Terreau | |
| 2008/0066801 A1 | 3/2008 | Schwartze | |

(Continued)

FOREIGN PATENT DOCUMENTS

WO    WO 2010100948 A1 *   9/2010

*Primary Examiner* — Susan D Leong  
(74) *Attorney, Agent, or Firm* — Yakov Sidorin; Quarles & Brady, LLP

(57) ABSTRACT

A photovoltaic module employing an array of photovoltaic cells disposed between two optically transparent substrates such as to define a closed-loop peripheral area of the module that does not contain a photovoltaic cell. The module is sealed with a peripheral seal along the perimeter; and is devoid of a structural element affixed to an optically transparent substrate and adapted to mount the module to a supporting structure. The two substrates may be bonded together with the use of adhesive material and, optionally, the peripheral seal can include the adhesive material. The module optionally includes diffraction grating element(s) adjoining respectively corresponding PV-cell(s).

19 Claims, 9 Drawing Sheets

Related U.S. Application Data

(60) Provisional application No. 61/728,633, filed on Nov. 20, 2012, provisional application No. 61/728,641, filed on Nov. 20, 2012, provisional application No. 61/728,645, filed on Nov. 20, 2012, provisional application No. 61/563,339, filed on Nov. 23, 2011, provisional application No. 61/559,425, filed on Nov. 14, 2011, provisional application No. 61/559,980, filed on Nov. 15, 2011, provisional application No. 61/560,381, filed on Nov. 16, 2011, provisional application No. 61/562,654, filed on Nov. 22, 2011.

(56) References Cited

U.S. PATENT DOCUMENTS

| | | |
|---|---|---|
| 2008/0185033 A1 | 8/2008 | Kalejs |
| 2008/0257400 A1 | 10/2008 | Mignon |
| 2009/0151776 A1 | 6/2009 | Schindler |
| 2010/0206365 A1 * | 8/2010 | Chumney et al. ............ 136/255 |
| 2010/0212658 A1 | 8/2010 | Moller |
| 2011/0019349 A1 | 1/2011 | Pfeffer |
| 2011/0315191 A1 | 12/2011 | Takanashi et al. |

* cited by examiner

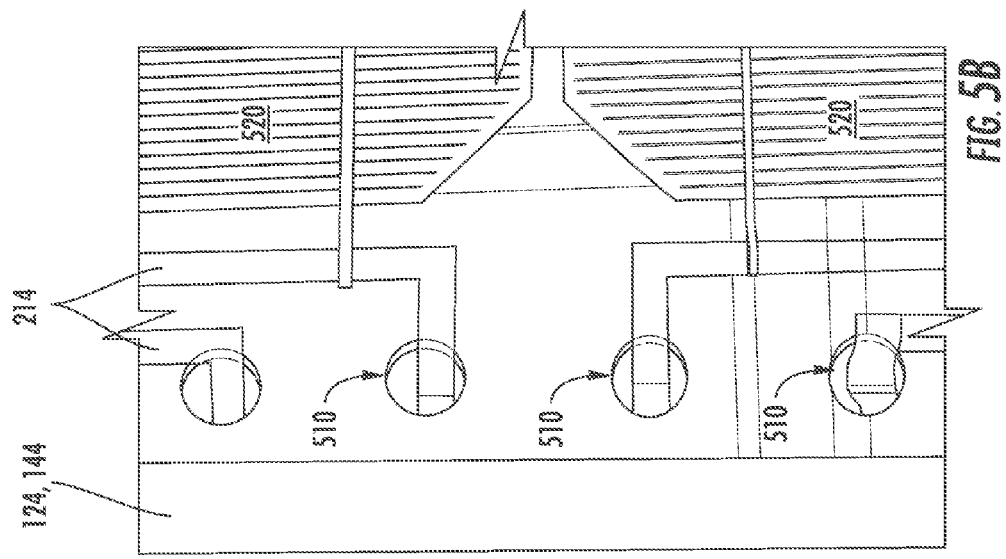
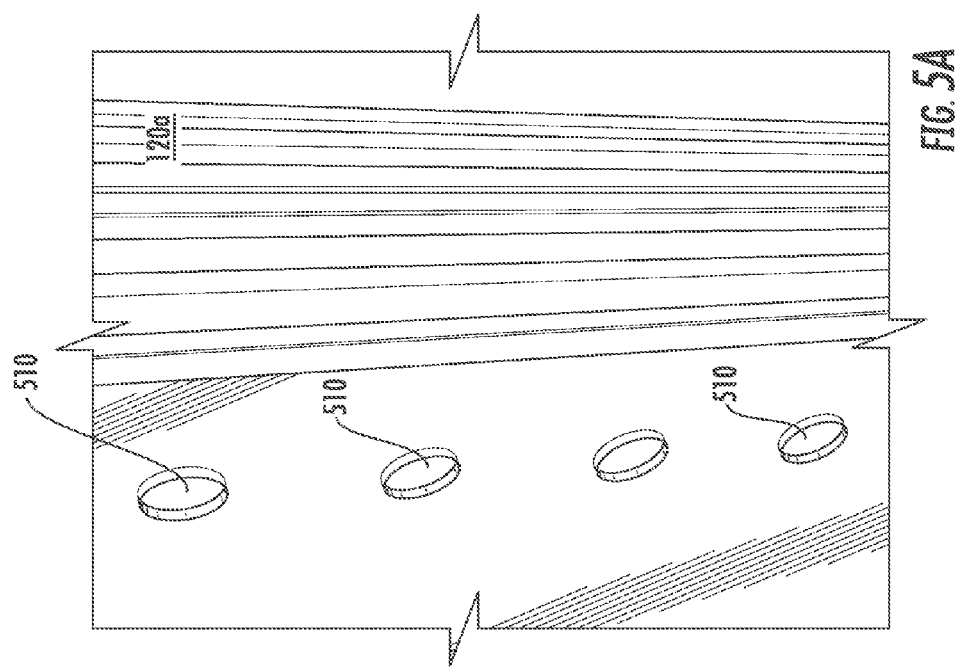

ns, for example (such as windows or skylights).
FRAMELESS PHOTOVOLTAIC MODULE

CROSS-REFERENCE TO RELATED APPLICATIONS

The present application is a continuation from U.S. patent application Ser. No. 13/775,744, published as US 2013/0160826, which in turn claims benefit of and priority from the U.S. Provisional Patent Applications Nos. (a) 61/728,633 filed on Nov. 20, 2012 and titled "Cell Spacing in Bifacial PV Modules"; (b) 61/728,641 filed on Nov. 20, 2012 and titled "Frameless PV Modules"; (c) 61/728,645 filed on Nov. 20, 2012 and titled "Redundant Bussing for PV Module with Unequal Efficiency PV Cells"; and (d) 61/563,339 filed on Nov. 23, 2011 and titled "Encapsulated Solar Energy Concentrator." Disclosure of each of the above referenced patent applications is incorporated herein by reference in its entirety.

The present application is also a continuation-in-part of the commonly assigned U.S. patent application No. 13/675,855 filed on Nov. 13, 2012 and titled "Flexible Photovoltaic Module", which in turn claims priority from U.S. Provisional Patent Applications Nos. (i) 61/559,425, filed on Nov. 14, 2011; (ii) 61/559,980 filed on Nov. 15, 2011; (iii) 61/560,381, filed on Nov. 16, 2011; and (iv) 61/562,654 filed on Nov. 22, 2011. The present application claims priority from each of the above-mentioned applications. The disclosure of each of the above-mentioned patent applications is incorporated herein by reference in its entirety.

TECHNICAL FIELD

The present invention relates to photovoltaic (PV) conversion of solar radiation and, in particular, to a PV modules or panel that is devoid of a structural frame.

BACKGROUND ART

Solar energy will satisfy an important part of future energy needs. While the need in solar energy output has grown dramatically in recent years, the total output from all solar installations worldwide still remains around 7 GW, which is only a tiny fraction of the world's energy requirement. High material and manufacturing costs, low solar module efficiency, and shortage of refined silicon limit the scale of solar power development required to effectively compete with the use of coal and liquid fossil fuels.

The key issue currently faced by the solar industry is how to reduce system cost. The main-stream technologies that are being explored to improve the cost-per-kilowatt of solar power are directed to (i) improving the efficiency of a solar cell that comprises solar modules, and (ii) delivering greater amounts of solar radiation onto the solar cell. In particular, these technologies include developing thin-film, polymer, and dye-sensitized photovoltaic (PV) cells to replace expensive semiconductor material based solar cells, the use high-efficiency smaller-area photovoltaic devices, and implementation of low-cost collectors and concentrators of solar energy.

The most common type of a photovoltaic panel in the market is a panel including with an (optionally) tempered glass frontsheet, a flexible backsheet, monofacial PV elements or cells, and surrounded with a structural frame adapted to impart rigidity on the overall construction and facilitate mechanical attachment of the panel to a supporting structure such as a foundation, a roof of a building, or an opening in a wall or ceiling.

By configuring a PV module without a frame while not compromising the structural integrity of the module, the cost of the module is significantly reduced. Moreover, however, the frameless module is easier to integrate into structures already used in the glass and construction industry (as compared to the module possessing the frame), thereby making the frameless module easier to use in architectural applications, for example (such as windows or skylights).

SUMMARY OF THE INVENTION

Embodiments of the present invention provide a photovoltaic (PV) module that includes first and second optically transparent substrates; a PV cell between the first and second substrates; and a first flexible sealing material sealably connecting the first and second substrates around a perimeter of the module, said module being devoid of a substantially rigid housing. An embodiment may optionally further include an encapsulant material covering a photo-voltaically operable surface of the PV cell. The first and second substrates may be disposed in a spaced-apart and substantially tangentially parallel relationship. A related embodiment may additionally include a third optically transparent substrate disposed in a spaced-apart and substantially tangentially parallel relationship with respect to the second substrate such as to define a gap therebetween, a PV cell in the gap, and a second flexible sealing material sealably connecting the second and third substrates around a perimeter of the PV module.

Specific implementation of the module can contain an array of electrically interconnected PV cells, which array has transverse dimensions at least one of which is smaller than a transverse dimension of the PV module. Such array may be disposed between the first and second substrates or between the second and third substrates such as to define a peripheral area of the PV module that does overlap with a PV cell.

BRIEF DESCRIPTION OF THE DRAWINGS

FIG. 5A shows a glass substrate containing vias therethrough for accommodating of electrical wiring elements of an embodiment of the invention;

FIG. 5B shows a portion of an embodiment of the invention including the substrate of FIG. 5B, laminated with and integrated to photovoltaic cells, electrical connectors; and sealing material;

DETAILED DESCRIPTION

Figure 1A:
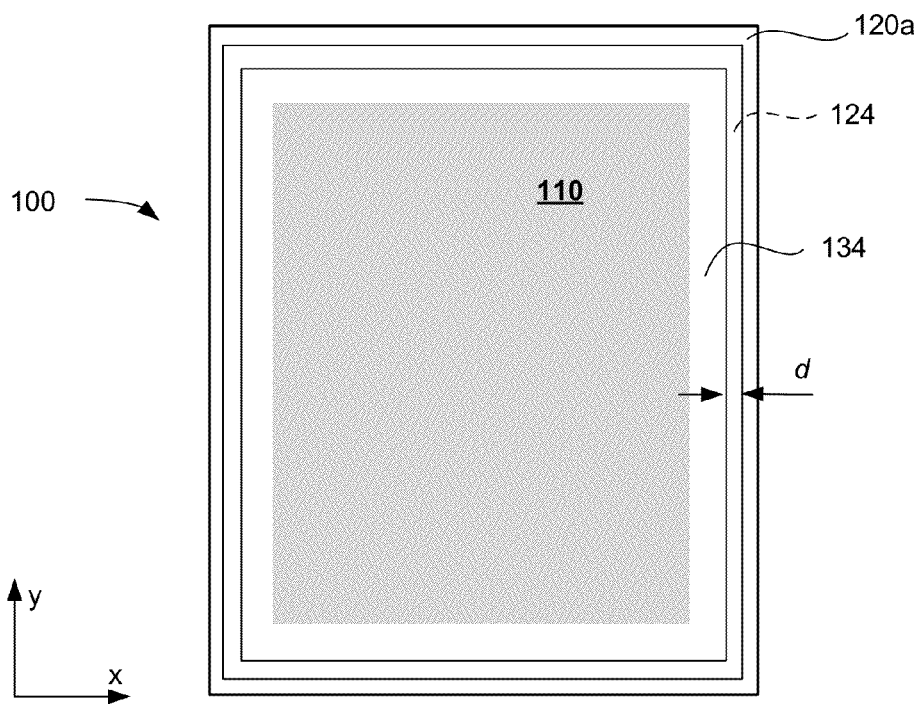
FIG. 1A is a diagram showing schematically top view of an embodiment of the invention.

References throughout this specification to "one embodiment," "an embodiment," "a related embodiment," or similar language mean that a particular feature, structure, or characteristic described in connection with the referred to "embodiment" is included in at least one embodiment of the present invention. Thus, appearances of the phrases "in one embodiment," "in an embodiment," and similar language throughout this specification may, but do not necessarily, all refer to the same embodiment. It is to be understood that no portion of disclosure, taken on its own and in possible connection with a figure, is intended to provide a complete description of all features of the invention.

In addition, the following disclosure may describe features of the invention with reference to corresponding drawings, in which like numbers represent the same or similar elements wherever possible. In the drawings, the depicted structural elements are generally not to scale, and certain components are enlarged relative to the other components for purposes of emphasis and understanding. It is to be understood that no single drawing is intended to support a complete description of all features of the invention. In other words, a given drawing is generally descriptive of only some, and generally not all, features of the invention. A given drawing and an associated portion of the disclosure containing a description referencing such drawing do not, generally, contain all elements of a particular view or all features that can be presented is this view, for purposes of simplifying the given drawing and discussion, and to direct the discussion to particular elements that are featured in this drawing. A skilled artisan will recognize that the invention may possibly be practiced without one or more of the specific features, elements, components, structures, details, or characteristics, or with the use of other methods, components, materials, and so forth. Therefore, although a particular detail of an embodiment of the invention may not be necessarily shown in each and every drawing describing such embodiment, the presence of this detail in the drawing may be implied unless the context of the description requires otherwise. In other instances, well known structures, details, materials, or operations may be not shown in a given drawing or described in detail to avoid obscuring aspects of an embodiment of the invention that are being discussed. Furthermore, the described single features, structures, or characteristics of the invention may be combined in any suitable manner in one or more further embodiments.

Moreover, if the schematic flow chart diagram is included, it is generally set forth as a logical flow-chart diagram. As such, the depicted order and labeled steps of the logical flow are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow-chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Without loss of generality, the order in which processing steps or particular methods occur may or may not strictly adhere to the order of the corresponding steps shown.

The invention as recited in claims appended to this disclosure is intended to be assessed in light of the disclosure as a whole, including features disclosed in prior art to which reference is made.

As broadly used and described herein, the reference to a layer as being "carried" on or by a surface of an element refers to both a layer that is disposed directly on the surface of that element or disposed on another coating, layer or layers that are, in turn disposed directly on the surface of the element. A "laminate" refers generally to a compound material fabricated through the union of two or more components, while a term "lamination" refers to a process of fabricating such a material. Within the meaning of the term "laminate," the individual components may share a material composition, or not, and may undergo distinct forms of processing such as directional stretching, embossing, or coating. Examples of laminates using different materials include the application of a plastic film to a supporting material such as glass, or sealing a plastic layer between two supporting layers, where the supporting layers may include glass, plastic, or any other suitable material.

Embodiments of the invention utilize either single-sided PV cells (also referred to as monofacial PV cells) or bifacial PV cells. A bifacial photovoltaic cell allows for harvesting of solar energy from both the front and the back sides of the cell substantially without changing the structure of the cell. Bifacial solar cells that are currently available commercially are known to generally have unequal efficiencies of solar energy conversion associated with the front and back sides of an individual PV cell. It is appreciated, when such unequal-efficiency bifacial PV cells (UEB-cells) are assembled into conventional panels or series such that the "front" or "first" sides (high efficiency sides) of all the cells are oriented to intercept direct sunlight, while the lower efficiency or "back" sides are oriented to receive sunlight delivered indirectly (from scatter, reflection off of the ground, or mounting surface, for example), the electrical energy output from the resulting PV panels or modules is not optimized. The PV modules containing bifacial cells are usually positioned with the side of a cell having higher efficiency generally facing south (in the northern hemisphere), to capture the maximum amount of direct solar radiation possible. Embodiments of a PV module utilizing structurally different disposition of UEB-cells has been disclosed in a co-assigned U.S. patent application Ser. No. 13/743,122, the entire disclosure of which is incorporated herein by reference.

Optionally, embodiments of the present invention employ at least one diffractive optical component that includes a layered structure with a diffraction grating that may be disposed in optical communication with a PV-cell of the module and be co-planar with such PV-cell. Such layered structure rating lends itself to being produced in a stamped roll-to-roll process.

Conventionally used PV modules utilize a structural frame to supplement and increase the rigidity afforded by lite(s) of glass (also referred to herein as substrates and superstrate) in juxtaposition with which the PV cells are disposed, while also providing a small measure of environmental protection through the bonding agent of the frame to the module (Silicone sealant, edge tape, etc.).

Embodiments of the PV modules according to the present invention are adapted to utilize the rigidity afforded by two laminated sheets of glass or transparent plastic (between which the electrically connected PV cells and, optionally, auxiliary diffractive optical elements are sandwiched) to for all of the structural rigidity of the module and are devoid of any external structural frame. The thickness of the individual glass sheets may vary, and generally depends on the structural rigidity required by the application. For example, in a specific architectural application a laminated lite of glass can be as thick as ¾ mm or more; while more generally each glass sheet is about 3.2 mm in thickness. In applications that require a higher load resistance (such as modules structured to operate in hurricane zones, skyscrapers, or where the glass itself is to be used to support part of the structural load), an appropriately thicker glass would be used.

According to one implementation of the invention, an array (whether a linear array or a two-dimensional) of operably-connected PV-cells is sandwiched (and, optionally, encapsulated with appropriate encapsulating material, as discussed elsewhere in this application) between at least two transparent substrates disposed in a substantially parallel and spaced-apart relationship to form a gap therebetween. The array of PV-cells is housed in this gap. In order to protect the PV-cell-containing environment of the gap from the external influence (such as ambient moisture, for example), a peripheral seal is added along the perimeter of the resulting unit. In one embodiment, the peripheral seal forms a ring of substantially moisture proof seal along the edges of the two substrates of the PV module. Such seal may be formed from a conforming elastic material that facilitates environment-caused changes in mutual positioning and/or dimensions of the unit (for example, the expansion of the components of the unit due to heat).

Figure 1B:
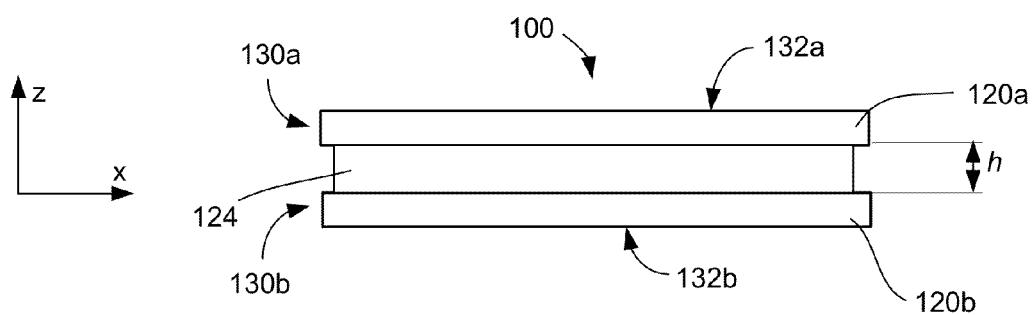
FIG. 1B is a side view of an embodiment of the invention.

An example of the PV module 100 is shown, in front and side views, in FIGS. 1A, 1B. Here, the compilation of PV-cells (optionally arranged in an array of PV cells) and associated electrical busses (arranged according to the embodiments of the present invention, for example according to embodiments 400, 500) is generally denoted with a shaded area 110 and disposed between the two substantially parallel lites of glass 120a, 120b that are sealingly affixed to one another with a perimeter seal 124 disposed between the lites 120a, 120b in a peripheral portion of the unit 100. The perimeter seal 124 may be optically opaque, translucent, or transparent and made of material such as, for example, desiccated edge seal, silicone or other materials. Optionally, the peripheral seal along the perimeter of the module can include the same material that is used in the adhesive bonding the substrate and superstrate of the PV module together. The front surface of the module is denoted as surface 132a, while the back surface of the module is noted as surface 132b. The peripheral area 134 of the PV module that does not contain a PV cell is defined as an optically transparent closed band portion, of the substrates (120a, 120b), a width of which is substantially equal to a difference between a transverse dimension of the area 110 and a transverse extent of the PV module 100.

The edge seal barrier 124 is laminated around the periphery of the module, substantially in the same layer as the PV cells of the module. In one implementation, the edge seal barrier 124 is about 1 mm±0.5 mm in height (parameter h in FIG. 1B) and between about 2 and about 20 mm in width (parameter d in FIG. 1A), depending on the application. Embodiment of the PV modules laminated with encapsulating materials that differ from the industry standard ethylene-vinyl acetate (EVA) (such as, for example, Dupont's Surlyn or other ionomer/thermoplastic or silicone based materials), may not necessarily require this edge seal protection.

Generally, the perimeter seal 124 is shaped as a closed loop or ring with a width d sufficient to make the seal substantially impenetrable to the ambient atmosphere. In FIGS. 1A, 1B the seal 124 is shown to be disposed on the inboard side of the substrates 120a, 120b with a small offset with respect to the edges of the substrates (edges 130a, 130b, for example). In a related embodiment, however (not shown) the perimeter seal may be sized such that a dimensional extent of the seal is substantially equal to a dimensional extent of the PV module. For example, an overall width of the seal 124 may be substantially equal to the overall width of the unit 100 and/or an overall length of the seal 124 may be substantially equal to the overall length of the unit 100. In such an embodiment, the peripheral/perimeter seal 124 is disposed substantially "flush" with the edges of the module (such as edges 130a, 130b). The PV-module such as the module 100 is preferably devoid of any structural frame around the perimeter of the module.

Figure 1C:
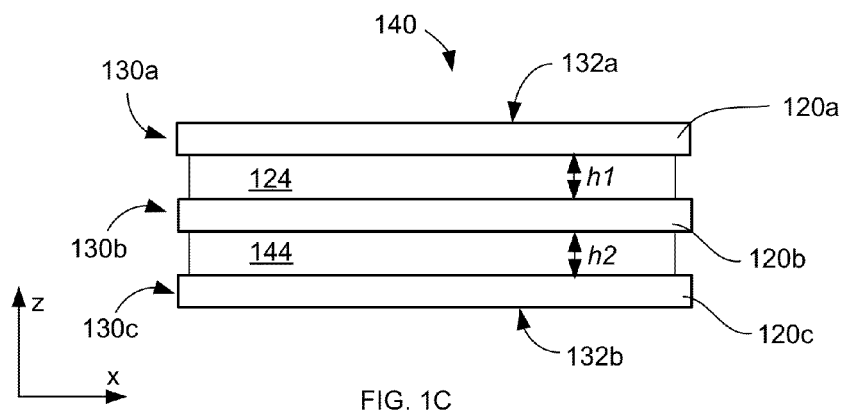
FIG. 1C is a side view of a related embodiment of the invention.
Figure 1D:
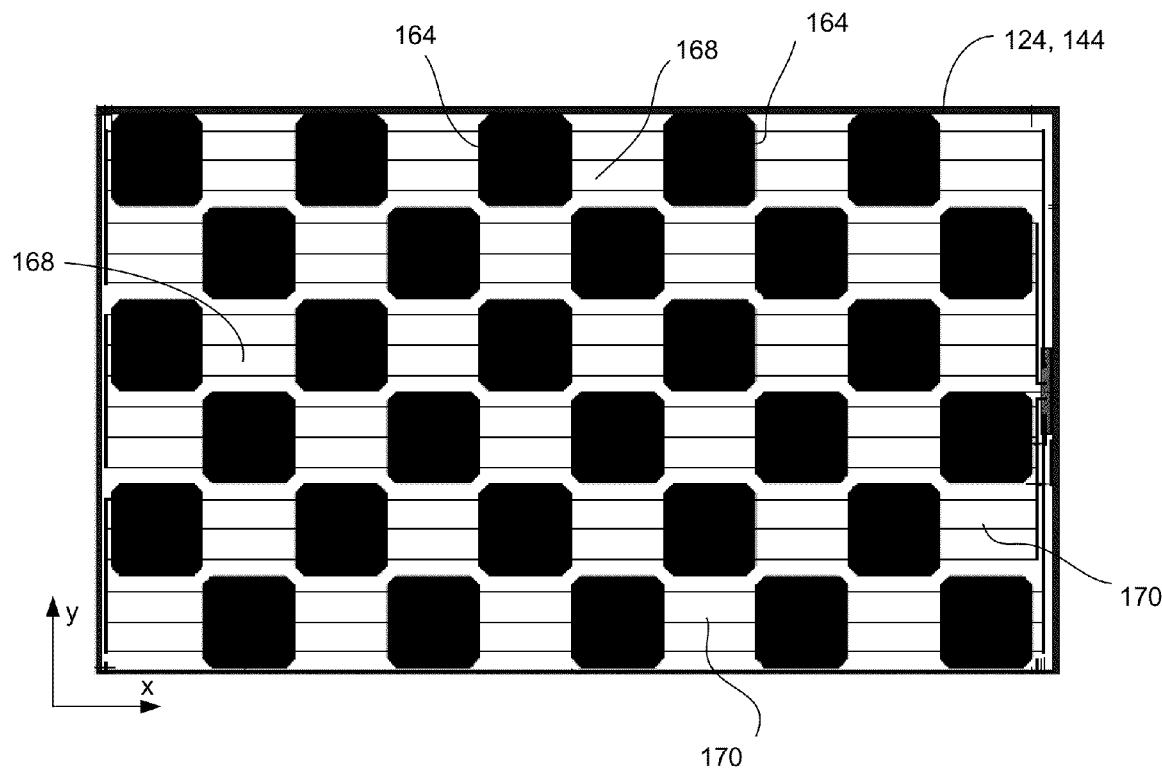
FIG. 1D is a diagram illustrating a top view of an embodiment with first arrangement of photovoltaic cells in an embodiment of the invention.
Figure 1E:
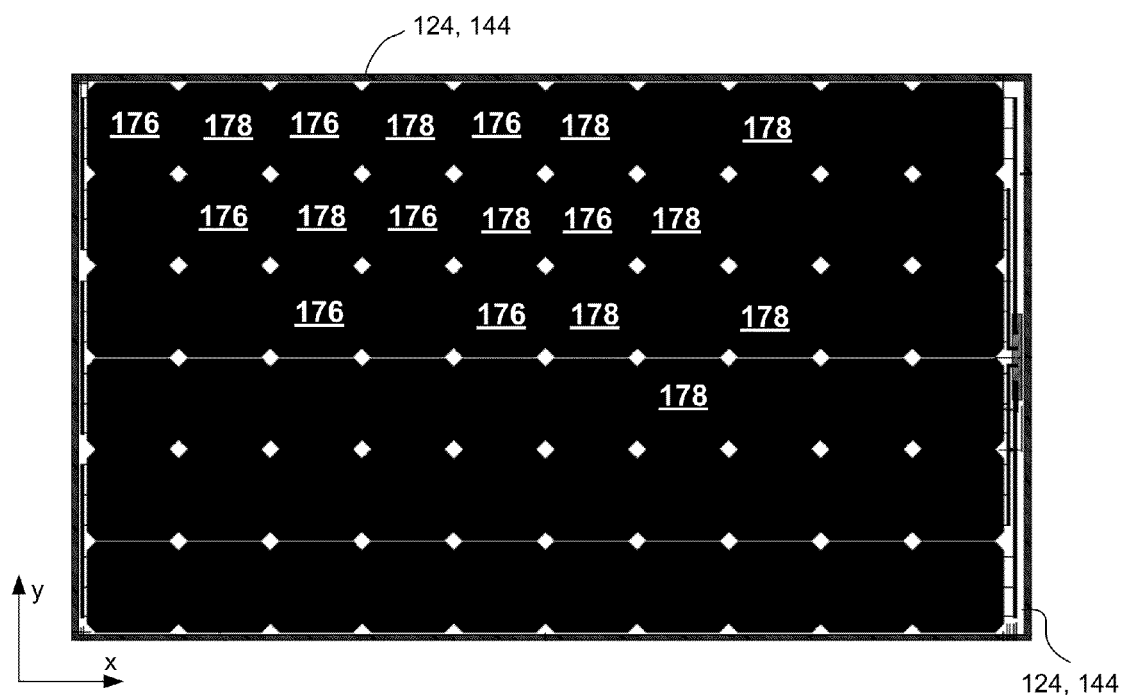
FIG. 1E is a diagram illustrating a top view of an embodiment with second arrangement of photovoltaic cells in an embodiment of the invention.

It is appreciated that an embodiment of a frameless PV module including more than two transparent substrates is also within the scope of the invention. As schematically illustrated in FIG. 1C inside view, the example of embodiment 140 of the module includes three optically transparent substrates 120a, 120b, 120c disposed in a spaced-apart and substantially parallel relationship such as to form gaps between immediately adjacent substrates. These gaps contain PV cells that form, when viewed from the top, at least one PV-cell array and are shown sealed with peripheral seals 124, 144 disposed around the perimeter of the module 140 in fashion similar to that of the embodiment 100. In one implementation, individual PV cells that are disposed on one level (for example, between the substrates 120a, 120b) are electrically connected to one another in a first pre-determined configuration to form a first PV cell array, while individual PV cells disposed on another level (for example, between the substrates 120b, 120c) are electrically connected to one another in a second pre-determined configuration to form a second PV cell array. Such first and second arrays may or may not be operably connected with one another (i.e., they may operate independently from one another). In the case of such multi-level PV module structure, the PV cells of the first array are preferably disposed such as to not, in operation, cast a shadow on or block from the sun the PV cells of the second array and vice versa. FIG. 1D, for example, provides a top plan view of a PV module 160 in which the individual PV cells 164 are arranged in a checker-board pattern. If in a multi-level embodiment of the PV module 140 discussed above the PV cells at the first level (between the substrates 120a, 120b) are organized according to the pattern of FIG. 1D, then the PV cells at the second level (between the substrates 120b, 130c) may be organized in a checker-board pattern that is complementary to the pattern of FIG. 1D. Specifically, the PV cells at the second level may be disposed at locations that, in the embodiment 160 correspond to the spacings 168 between the PV cells 164, while the spacings between the PV cells at the second level will spatially correspond to the PV cells at the first level. Elements 170 denote electrical bussing and/or wiring associated with PV cells of a given level. The top plan view of a related two-level embodiment 174, structured according to the principles depicted in FIGS. 1C and 1D but containing a different number of individual PV cells, is presented in FIG. 1E. Here, the elements 176 depict the PV cells at the first level of the embodiment 172 and the elements 178 depict the PV cells at the second level of the embodiment 172. For simplicity of illustration, only a few individual PV cells are numbered in FIG. 1E.

A PV module structured with a glass front and back sheets has several inherent advantages when compared to conventional PV modules employing flexible backsheets. These advantages include higher fire resistance, higher humidity and UV protection afforded for the internal components (such as PV cells, wiring, diffractive elements); high transparency and low optical birefringence of the PV module in operation; reduced and often eliminated "yellowing" of the substrate material (due to UV exposure); and a higher rigidity without the use of an integrated structural frame. The glass-to-glass construction is also desirable for building integrated applications in which laminated glass structures are required for structural/safety reasons. The glass/glass modules are laminated with materials and techniques similar to plate glass or safety glass lamination thereby allowing, with proper design, to use the embodiments of the PV modules of the invention in architectural applications. A typical laminated structure of a PV module includes a tempered glass substrate, adhesive, PV-cell-containing layer, a hologram layer (if applicable), adhesive, and tempered glass superstrate. The structure is laminated in an heated environment with vacuum and pressure applied to the structure progressively.

FIGS. 1E, 2, 3, and 4 are diagrams showing, in top views and in greater detail, PV modules (whether single- or multiple-level) according to embodiments of the invention. The arrangements of individual PV cells in these diagrams corresponding to PV cell arrays disposed on a single level and/or, in addition or alternatively, on multiple levels of a corresponding PV module.

Figure 2:
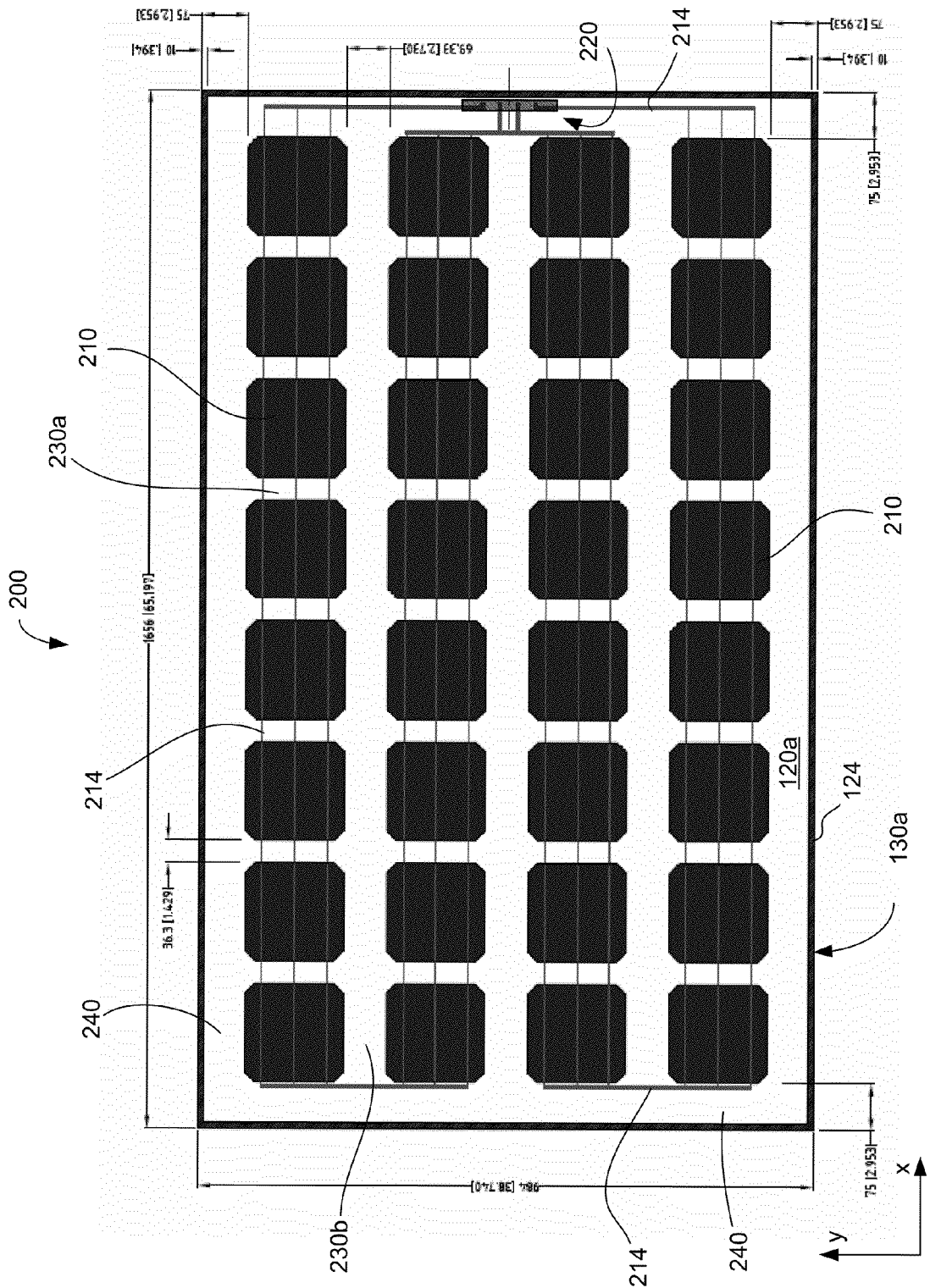
FIG. 2 is a diagram illustrating an alternative arrangement of photovoltaic cells in a related embodiment of the invention.

FIG. 2, for example, presents a top view of an embodiment 200 of the frameless PV module containing thirty two (32) PV cells 210 appropriately electrically connected with bussing or wiring 214 and arranged in a rectangular two-dimensional array disposed between at least two mutually-parallel lites of glass (such as lites 120a, 120b of FIGS. 1A, 1B). The electrical connections 214 operably lead to the junction box (or J-box) 220, which is used to interconnect the module with the external electrical wiring and systems an/or other modules. The cell-to-cell spacings 230a, 230b, separating the individual cells 210 in rows and columns, are appropriately controlled and adapted to ensure that a predetermined portion of sunlight incident onto the PV module 200 in operation is transmitted through the PV module 200 (i.e., through the lites 120a, 120b) for illumination purposes of a scene that is otherwise blocked from the sun by the module 200.

A transparent area formed, as a closed band, around the array of the cells 210 between the edge 120a and the outer boundary of the array of the PV cells 210 (cell-to-edge separation or clearance), is optional. In an embodiment where such cell-to-edge separation is present, it preferably satisfies two conditions. On the one hand, the cell-to-edge separation may be sized to be greater (wider) than an extent of a portion of an external supporting structure (such as clamp, frame, or the like) that overlaps with the module 200 and/or extends towards the PV cells 210 inward with respect to the edge (for example, edge 120a) of the module 200 when used in juxtaposition with the embodiment to attach the embodiment to a surrounding structure or support for proper operation. On the other hand, in addition or alternatively, the cell-to-edge separation may be sized to be greater (wider) than an extent of a shadow that such external supporting structure will cast on the module during its typical time of operation. In applications in which the frameless PV module is to be used with external attachments or mounting systems that might shade the cells in the module, (such as conventional mounting clips from traditional rooftop mounting PV systems, for example), the clearance around the edge of the module and the cells in the module is increased such as to account for the module-intruding shading and the shading caused by the height of the mounting elements as the sun moves throughout the day and season. The extent of the shadow cast can be estimated using the principles outlined, for example, in Thakkar, N., Cormode D., et al., "*A simple non-linear model for the effect of partial shade on PV systems*" (Photovoltaic Specialists Conference (PVSC), 2010 35th IEEE; Honolulu, Hi., IEEE: 002321-002326; 2010).

Figure 3:
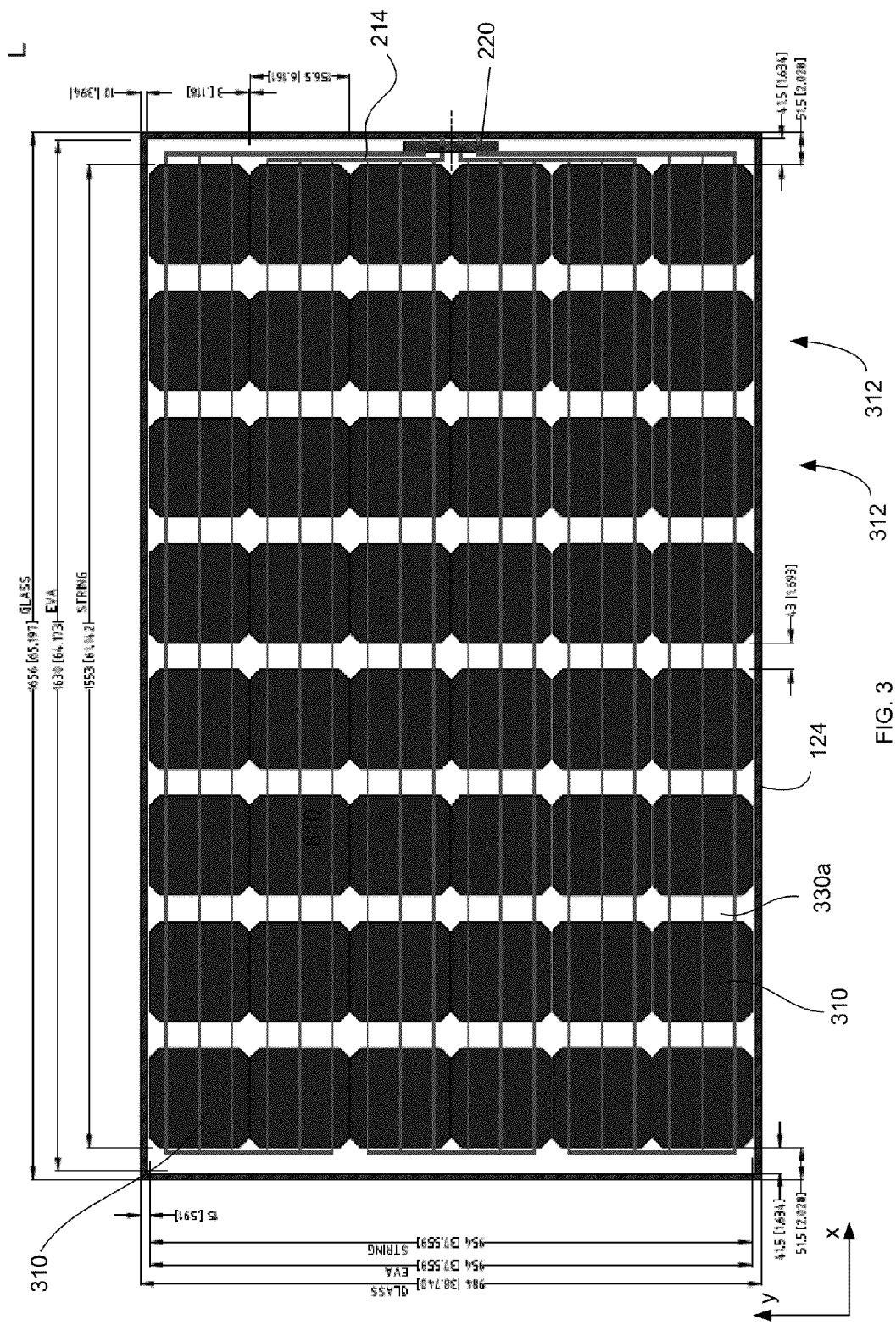
FIG. 3 is a diagram illustrating an alternative arrangement of photovoltaic cells in another related embodiment of the invention.

FIG. 3 illustrates a related embodiment 300, in which a two-dimensional array of PV cells 310 includes columns 312 separated by the spacings 330 such that in each column 312 the immediately adjacent cells 310 are substantially adjoining each other. Again, as in the embodiment 200, the embodiment may be configured to include an optional cell-to-edge spacing (not shown).

Figure 4:
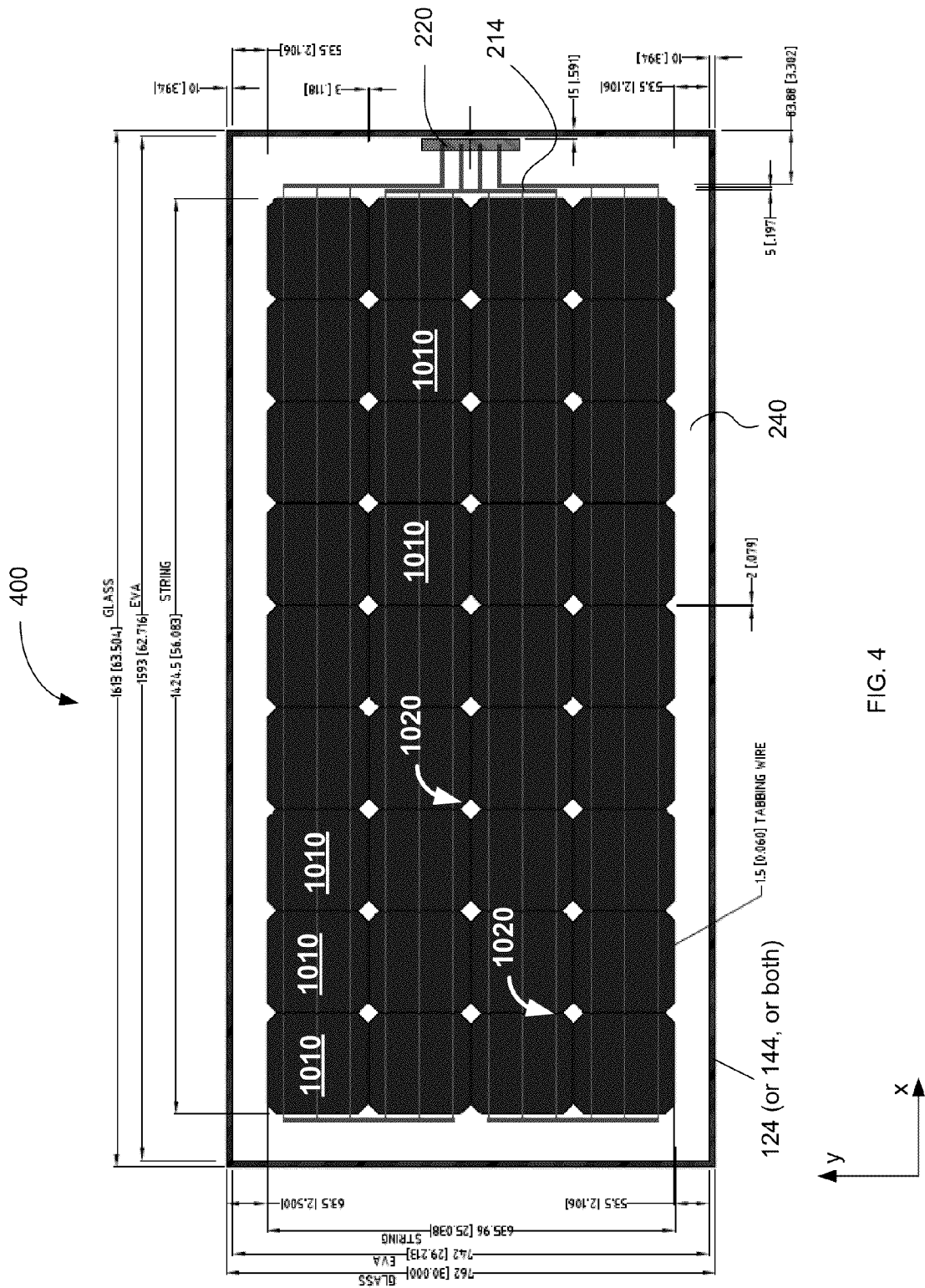
FIG. 4 is a top view of another embodiment of the invention showing an alternative arrangement of photovoltaic cells.

FIG. 4 illustrates a related embodiment 400, in which individual PV cells 410 are arranged in a two-dimensional array such that a given PV cell 410 is substantially adjoining each and every neighboring PV cell, thereby leaving a minimal amount of spacing between or among the neighboring cells. Depending on the shape of individual PV cell, some small areas in the overall foot-print of the PV-module (such as, for example, areas 420) may remain substantially transmissive to the sunlight incident substantially normally to the surface of the front or back surfaces 132a, 132b of the module 400.

In the embodiments of the invention that are structured to direct wiring (or bussing, or electrical connectors) between the individual PV cells towards the back or front surface of the module for electrical interconnections (for example, to provide electrical contact(s) with a back-mounted junction box), the glass substrate/superstrate (for example, substrate 120a) may be structured to include openings 510 to allow the wiring to pass therethrough, as shown in FIGS. 5A, 5B. (FIG. 5A illustrates a substrate 120a with the openings 510 prior to assembly of the PV module; FIG. 5B shows a portion of the already-assembled and laminated PV module with PV cells 520 and bussing 214.) To achieve this, in one implementation, sheets of glass are drilled or ablated in the precisely defined locations and then optionally tempered. The drilled holes 510 can be additionally and optionally treated to have mechanical stress relieved (such as chamfering, grounding of edges and the like.)

Figure 6B:
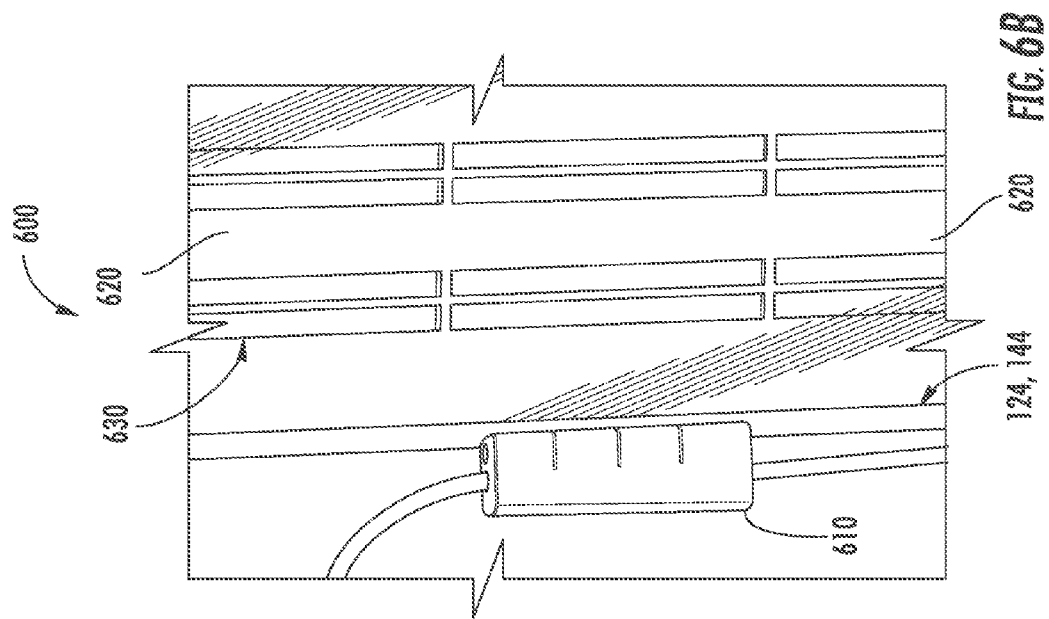
FIG. 6A shows an embodiment of the invention containing holographic elements and edge-mounted junction box.
FIG. 6E is a close-up view of the embodiment of FIG. 6A.
Figure 6A:
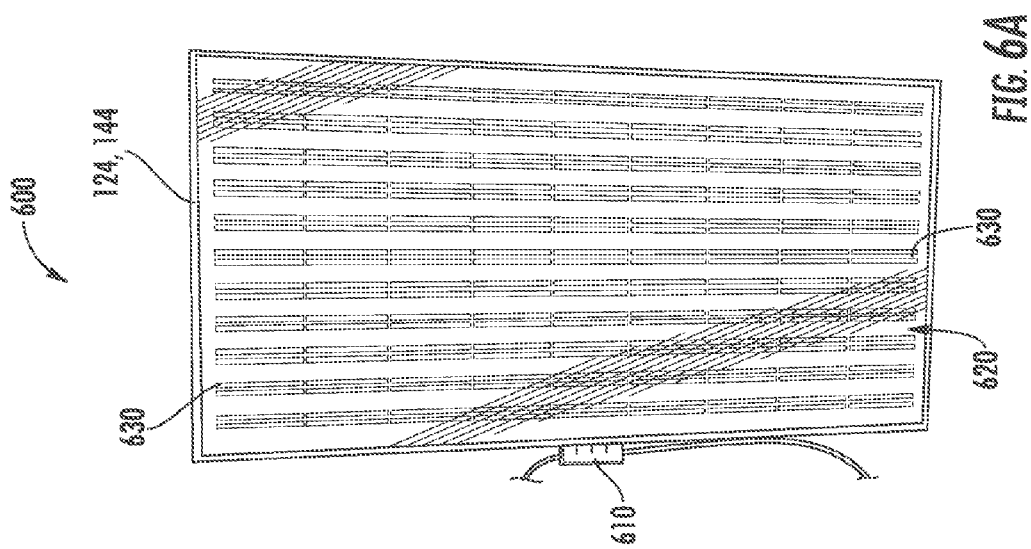

In reference to FIGS. 6A, 6B, on the other hand, in applications where the inter-PV-cell wires/connectors/busses are not required to be drawn through the substrate or superstrate of the PV module, the wiring or bussing 214 may be extended towards an externally disposed electrical circuitry (such as a junction box 610) through one of the sides and/or over the edge(s) of the module (for example, the edge 130a). The embodiments of FIGS. 6A, 6B additionally include internally-disposed holographically-defined diffractive optical elements 620 in optical communication with corresponding PV cells 630. Examples of such diffractive elements, methods of their fabrication, and techniques for integration of these elements with other components of the PV module are described, for example, in U.S. patent application Ser. No. 13/682,119 the entire disclosure of which is incorporated herein by reference.

Figure 7:
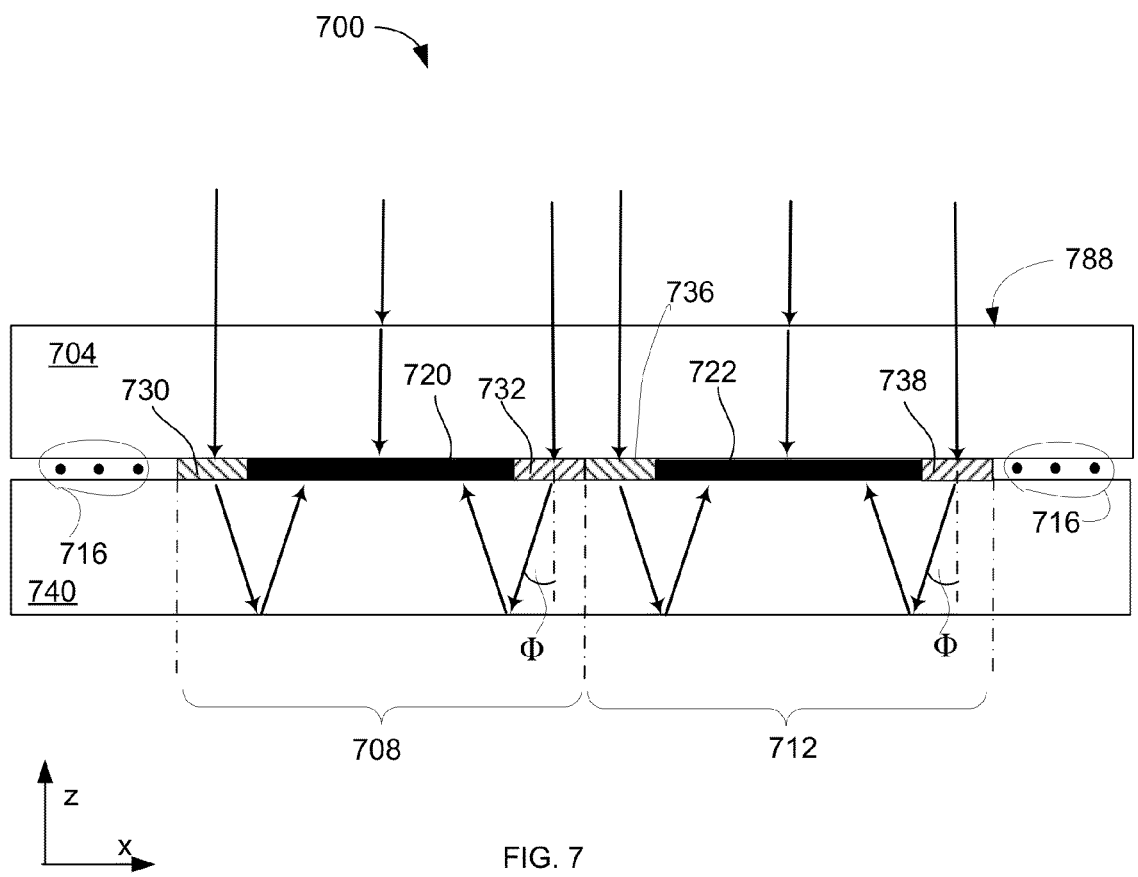
FIG. 7 is a simplified cross-sectional view showing schematically mutual disposition of photovoltaic cells and holographic elements in an embodiment of the invention.

For example, as shown in a cross-sectional sketch representing a related embodiment 700 of FIG. 7, the embodiment 700 may be a multi-portion (or multi-period) embodiment and, as shown, includes first and second portions 708, 712. (Additional portions or periods, optionally present, are indicated with ellipses 716.) Each of the portions or periods 708, 712 includes a corresponding bifacial PV-cell (720 or 722) that is surrounded by (and substantially co-planar with) respectively-corresponding holographically-recorded diffraction grating layers (730, 732) or (736, 738). The holographic grating containing layers 730, 732, 736, 738 include, in one embodiment, transmissive bulk holographic diffraction gratings recorded in a dichromated gelatin layer. The pairs of the grating-containing layers can be cooperated with the corresponding bifacial PV-cell (on the sides of such cell) with or without spatial gaps separating them from the cell. Each of the grating-containing layers 730, 732, 736, 738 may be incorporated into an encapsulant layer which is used laminate bifacial PV-cells 720, 722 together with the corresponding pairs of gratings (730, 732) and (736, 738) to front and back covers 704, 740 of the embodiment. Various arrows in FIG. 1 indicate propagation of sunlight incident onto the surface 788 of the embodiment 700.

When the embodiment of the invention includes a PV-module utilizing bifacial PV cells, the junction box is preferably placed at the back of the module or in the vicinity of the edge of the module to minimize or eliminate a possibility that the junction box, in operation, will block solar radiation from impinging onto at least one side of the PV cell. The shading of the PV module is minimized to reduce the loss associated with decreased local illumination and possible detrimental effects such as extra heating, serially limiting the current in a string, etc. FIGS. 2-4, and 6A, 6B illustrate several examples of operably appropriate cooperation between the junction box (220, 610) and the PV cells (210, 310, 4101, 630). In implementation of frameless PV-modules that do not use bifacial cells or edge mounted junction boxes, a medium or large format junction box may be juxtaposed with a surface at the back of the module.

Some embodiments of a frameless PV-module (such as, for example, embodiments similar to the embodiments 200, 300) are structured to ensure that a portion of incident ambient light is converted into electrical power and a portion of such incident light is transmitted through the spacings (230a, 230b, 330a) between or among the cells thereby defining the PV module as partially transmissive. So structured embodiments of a frameless PV-module of the invention is enabled, therefore, to be used as part of a ceiling or windows in a building where it is desired to illuminate the interior of the building with natural light while utilizing sunlight for electrical power generation.

The overall light transmittance T through so structured frameless PV-module can be calculated as T(%)=100%[1−R−A], where R and A denote reflectance and absorbance of sunlight by the module. Assuming a 4A % reflection from glass and using the Beer-Lambert Law the transmittance value is rewritten as:

$$T(\%) = 100\% * 0.96 * e^{-\alpha d} * \left[1 - \frac{A_S + NA_C + A_W + A_J}{A_\Sigma}\right]$$

Here, $\alpha$ is the absorption coefficient of the transparent areas of the PV module, d is the module thickness, $A_S$ is the area of supporting structure that casts shadow on the module, N is the number of PV cells, $A_C$ is an area of a single PV cell, $A_W$ is the area occupied by the electrical wiring (bussing, connectors), $A_J$ is the projected onto the module area of the J-box, and $A_\Sigma$ is the total area of the PV module. In further reference to FIG. 2, once the number of bifacial cells and total module area that facilitate achievement of the desired light transmittance is determined, and the dimensions of the peripheral transparent area 240 are known, the extend and dimensions of the spacings 230a, 230b can be determined and varied to achieve different optical effects in light transmitted through the embodiment of the frameless module. For example, making the horizontal and vertical spacings 230a, 230b substantially equally wide will give more uniform illumination of the scene behind the PV-module. Minimizing one of these widths while maximizing another results in the transmitted light having a regularly spaced pattern in one dimension (light "columns"), as seen in FIG. 3, for example. As the skilled artisan will appreciate, various aesthetics possibilities can then be achieved within the constraints of the maxim transmittance possible.

As the light transmission of the PV module is increased, more light has an opportunity to interact with the surfaces behind the module and be scattered/reflected back towards the rear (with respect to the incident light) surface of the bifacial PV cells, thereby increasing the amount of energy produced per cell in the module. Modules produced with increased spacing between the cells will have a relatively larger surface area to radiate heat, lowering their temperature and again increasing the energy generated per cell.

While the preferred embodiments of the present invention have been illustrated in detail, it should be apparent that modifications and adaptations to those embodiments may occur to one skilled in the art without departing from the scope of the present invention.

For example, an a related embodiment (not shown), a frameless PV module may include an array of sub-PV-modules that are both mechanically and electrically connected through flexible joints and, optionally, have an overlaying cover layer shaped to include a dome-like structure. Implementations of flexible PV modules are discussed, for example, in the co-assigned U.S. patent application Ser. No. 13/675,855. Similarly, a related embodiment of the invention may include various encapsulating means directed to protect PV cell array from being exposed to the ambient as discussed, for example, in a co-assigned U.S. patent application Ser. No. 13/682,119. Disclosure of each of these two patent applications are incorporated herein by reference in its entirety.

What is claimed is:

1. A photovoltaic (PV) module comprising:
    first and second optically transparent substrates;
    a bi-facial PV cell between the first and second substrates;
    a first flexible sealing material disposed between and in contact with both the first and second substrates around a perimeter of the module to sealingly affix the first and second substrates to one another,
and
    an optically transparent layer disposed spaced-apart from and tangentially parallel to the second substrate such as to define a gap therebetween, a first PV cell in the gap, and a second flexible sealing material disposed between the first and second substrates around a perimeter of the PV module
    said module being devoid of a substantially rigid housing and a grounding wire.

2. A PV module according to claim 1, further comprising an encapsulant material covering a photo-voltaically operable surface of the bi-facial PV cell.

3. A PV module according to claim 2, wherein the first and second substrates are glass plane-parallel plates.

4. A PV module according to claim 1, further comprising a holographic grating element adjacent to and substantially coplanar with the bi-facial PV cell, said holographic grating element including a holographic grating embedded in an encapsulant material and configured to deliver light, incident onto a first surface of the PV module, to a first photo-voltaically operable surface of the bi-facial PV cell.

5. A PV module according to claim 1, further comprising a holographic grating element adjacent to and substantially coplanar with the bi-facial PV cell, said holographic grating element including a holographic grating embedded in an encapsulant material and configured to deliver light, incident onto a first surface of the PV module, to both photo-voltaically operable surfaces of the bi-facial PV cell.

6. A PV module according to claim 1, wherein the bi-facial PV cell and the first PV cell in the gap are electrically connected.

7. A PV module according to claim 1, wherein at least one of the first and second substrates includes a hole therethrough and an electrically conducting member electrically connected to the bi-facial PV cell and passing through said hole.

8. A PV module according to claim 1, comprising an array of electrically interconnected PV cells, said array having transverse dimensions at least one of which is smaller than a transverse dimension of the PV module, said array disposed between the first and second substrates to define a peripheral area of the PV module devoid of a PV cell.

9. A PV module according to claim 8, wherein said peripheral area of the PV module is defined by a closed band a width of which corresponds to a difference between the transverse dimension of the PV module and the transverse dimension of the array of PV cells.

10. A PV module according to claim 1, further comprising an electrical junction box integrated with the module such that, in operation, a shadow of said electrical junction box cast by sunlight does not fall on a PV cell.

11. A photovoltaic (PV) module comprising:
first and second optically transparent substrates;
a bi-facial PV cell between the first and second substrates;
an array of electrically interconnected PV cells,
    wherein said array has transverse dimensions at least one of which is smaller than a transverse dimension of the PV module,
    wherein said array is disposed between the first and second substrates to define a peripheral area of the PV module devoid of a PV cell,
    wherein said peripheral area of the PV module is defined by a closed band a width of which corresponds to a difference between the transverse dimension of the PV module and the transverse dimension of the array of PV cells;
and
a first flexible sealing material disposed between the first and second substrates around a perimeter of the PV module,
wherein said module is devoid of a substantially rigid housing and a grounding wire.

12. A PV module according to claim 11, further comprising a second flexible sealing material disposed between the first and second substrates around the perimeter of the PV module.

13. A PV module according to claim 11, further comprising:
an optically transparent layer disposed between the first and second optically transparent substrates, said optically transparent layer being spaced-apart from and tangentially parallel to the second substrate such as to define a gap between said optically transparent layer and the second substrate, said gap containing a first PV cell.

14. A PV module according to claim 13, wherein the bi-facial PV cell and the first PV cell contained in the gap are electrically connected.

15. A PV module according to claim 11, wherein at least one of the first and second substrates includes a hole therethrough and an electrically-conducting member electrically connected to the bifacial PV cell and passing through said hole.

16. A PV module according to claim 11, wherein the first and second substrates are glass plane-parallel plates.

17. A PV module according to claim 11, further comprising a first encapsulant material covering a photo-voltaically operable surface of the bi-facial PV cell.

18. A PV module according to claim 17, further comprising a holographic grating element adjacent to and substantially coplanar with the bi-facial PV cell, said holographic grating element including a holographic grating embedded in said encapsulant material, said module being dimensioned to deliver light, incident onto said holographic grating through a first surface of the PV module, to both photo-voltaically operable surfaces of the bi-facial PV cell.

19. A PV module according to claim 11, further comprising a holographic grating element adjacent to and substantially coplanar with the bi-facial PV cell, said holographic grating element including a holographic grating embedded in an encapsulant material and configured to deliver light, incident onto a first surface of the PV, to a first photo-voltaically operable surface of the bi-facial PV cell.

* * * * *